United States Patent [19]

Sakudo et al.

[11] 4,393,333

[45] Jul. 12, 1983

[54] MICROWAVE PLASMA ION SOURCE

[75] Inventors: Noriyuki Sakudo, Ohme; Katsumi Tokiguchi, Hachioji; Hidemi Koike, Tokorozawa; Ichiro Kanomata, Fuchu; Humihiko Nakashima, Katsuta, all of Japan

[73] Assignee: Hitachi, Ltd., Tokyo, Japan

[21] Appl. No.: 215,064

[22] Filed: Dec. 10, 1980

[30] Foreign Application Priority Data

Dec. 10, 1979 [JP] Japan .................. 54-169847[U]

[51] Int. Cl.³ .................. H01J 7/24; H05B 31/26
[52] U.S. Cl. .................. 315/111.81; 315/39; 315/111.41; 313/363.1; 313/364; 250/396 ML; 250/423 F
[58] Field of Search .................. 315/39, 111.4, 111.8, 315/111.41, 111.81; 313/363, 364, 359.1, 360.1, 361.1, 363.1, 364.1; 250/396 ML, 423

[56] References Cited

U.S. PATENT DOCUMENTS

| 2,665,384 | 1/1954 | Yockey | 250/396 ML |
| 3,212,974 | 10/1965 | Leboutet et al. | 250/423 |
| 3,375,452 | 3/1968 | Forsyth | 313/363.1 X |
| 3,390,293 | 6/1968 | Nunan | 313/363.1 |
| 3,778,656 | 12/1973 | Fremiot et al. | 313/363.1 |
| 4,287,419 | 9/1981 | Booth | 250/396 ML |
| 4,293,794 | 10/1981 | Kapetanakos et al. | 315/111.81 |
| 4,303,865 | 12/1981 | Swingle | 250/423 |

Primary Examiner—Saxfield Chatmon, Jr.
Attorney, Agent, or Firm—Antonelli, Terry & Wands

[57] ABSTRACT

A microwave plasma ion source according to the present invention is designed such that a microwave electric field and a magnetic field are applied to a discharge gas introduced into a discharge region, to form plasma, from which ions are extracted. The above magnetic field is formed by means of an electromagnet provided on the low-voltage side of ion extraction electrodes and a high-permeability member provided in that section which is on the side of a waveguide and which permits the microwaves to be propagated freely.

6 Claims, 9 Drawing Figures

MICROWAVE PLASMA ION SOURCE

FIELD OF THE INVENTION

The present invention relates to an ion source and, more particularly, to an improvement in a microwave plasma ion source suitably used to implant ions in semiconductor wafer.

DESCRIPTION OF THE PRIOR ART

A microwave plasma ion source has a long life and permits easily obtaining a large current. It is suitably used as an ion source for an ion implanter and practically used as such.

FIG. 1 is an exploded view of a conventional microwave plasma ion source for an ion implanter (U.S. Pat. No. 4,058,748). Referring to the drawing, microwaves of a frequency of 2.45 GHz generated in a microwave source (not shown), such as a magnetron are introduced into a discharge chamber 1 through a waveguide 2 having ridges 8, 8 therein. The discharge chamber 1 is joined to the waveguide 2 via a disc 3 consisting of a dielectric, such as a vacuum-sealing ceramic material. The discharge chamber 1 consists of discharge electrodes 5, 5, a discharge region formed between the discharge electrodes 5, 5, an inlet for a gas to be ionized, and a dielectric, such as boron nitride which fills those portions of the interior of the discharge chamber 1 other than the discharge region. The microwaves introduced into the discharge chamber 1 cause a strong microwave electric field in the discharge region formed between the discharge electrodes 5, 5. a strong magnetic field is applied to the discharge region in the direction (axial direction referring to FIG. 1) which is at right angles to the microwave electric field generated between the discharge electrodes 5, 5. In order to generate this magnetic field, a solenoid coil (not shown) is provided on the outer circumferential surface of the discharge chamber 1. In order to generate plasma in the discharge region, a needle valve 9 is opened to introduce a sample gas, such as phosphine gas ($PH_3$) thereinto. As a result, a high-density plasma is generated in the discharge region owing to the interactions of the microwave electric field and magnetic field. An ion beam 22 is extracted by ion extraction electrodes 6, 7, 7' from the high-density plasma generated in the above-mentioned manner.

Reference numeral 4' denotes a disc having a slit and consisting of a dielectric, such as boron nitride. The disc 4' serves to render the intensity of the microwave electric field highest in an ion beam extraction section. Accordingly, the plasma attains the highest density in the ion extraction section. Voltages of +50 kV, −2 kV and 0 V are applied to the ion extraction electrodes 6, 7, 7', respectively. Consequently, the discharge chamber 1 connected to the electrode 6 as well as the waveguide 2 have the same electric potential as the electrode 6. Thus, the electrode 6, discharge chamber 1 and waveguide 2 form a high voltage side, while the electrodes 7, 7' form a low-voltage side.

It is expected that an ion implanter will be used with a much larger current and a much higher ion extraction voltage in the future. However, the above-described conventional microwave plasma ion source has difficulties in obtaining a larger current and a higher ion extraction voltage in the following respects.

In the above-described microwave plasma ion source, a solenoid coil having a ground potential is provided around the outer circumferential surface of a discharge chamber 1 which should be maintained at a high electric potential. Moreover, it is necessary that a magnetic field of about 1 kilo-gauss is generated in the central portion of the solenoid coil, i.e. a discharge region. In this microwave plasma ion source (having a slit length of 40 mm and an ion extraction voltage of 50 kV), a solenoid coil having an inner diameter of 180 mm and an outer diameter of 350 mm is used. In order to obtain a larger current from this ion source, a longer slit and a larger discharge region are required) it is necessary that the inner diameter of the solenoid coil be increased. When the inner diameter of the solenoid is increased, it is necessary that the outer diameter thereof be increased as well because the intensity of magnetic field in the discharge region requires to keep the same level. Also, the capacity of a power source for magnetizing the solenoid coil is necessarily increased to a great extent.

It is also necessary in the above microwave plasma ion source that a magnetic field having lines of magnetic force 21 parallel to a discharge region 20 (formed between discharge electrodes 5, 5) as shown in a model chart in FIG. 2 or a magnetic field having lines of magnetic force diverging in the direction 22 of ion extraction be generated. In order to generate such a magnetic field, three solenoid coils 17, 18, 19 are provided as shown in FIG. 2 around the discharge region 20. However, it is necessary as mentioned above that the solenoid coils be provided on the high-voltage side 23 and that the solenoid coil 19 be provided such as to be extended over the high-voltage side 23 and low-voltage side 24. It is difficult in this arrangement to install an insulating means therein for preventing discharge from occurring between the waveguide 2, discharge chamber 1 and electrodes 5 which form the high-voltage side of as high as +50 kV and the solenoid coils 17, 18, 19 having a ground potential. This makes it much more difficult to obtain a higher ion extraction voltage. If the distance between the high-voltage side and low-voltage side is increased for the purpose of solving this problem, the inner and outer diameters of the solenoid coils 17, 18, 19 are increased. This causes such a problem as referred to above.

SUMMARY OF THE INVENTION

Therefore, an object of the present invention is to provide a miniaturized microwave plasma ion source of a low power consumption which is free from the above-mentioned drawbacks encountered in a conventional ion source of this kind.

To the above end, the present invention provides a microwave plasma ion source comprising an electromagnet on the low-voltage side of ion extraction electrodes, and a high-permeability member provided in such a region on the side of a waveguide that permits microwaves to be propagated freely, whereby a magnetic field of necessary shape and intensity is formed in a discharge region.

Owing to such a characteristic structure of the present invention, a higher voltage can be obtained with the inner and outer diameters of a solenoid coil, an electromagnet not influenced by the dimensions and shapes of electrodes, a discharge chamber and a waveguide. Accordingly, a microwave plasma ion source as a whole can be miniaturized, and an increase in power consumption can be minimized at once. According to the present invention, a solenoid coil is provided on the low-voltage side. Therefore, it is unnecessary to install between the low-voltage side and high-voltage side an insulating means which is required in a conventional microwave ion source. In other words, the high-voltage side in a microwave plasma ion source according to the present invention can be insulated very easily from the low voltage side. Moreover, owing to a combination of a suitably arranged high-permeability member and a solenoid coil, an ideal, mirror-shaped magnetic field is formed in a discharge zone. This allows a high-density plasma to be obtained.

DESCRIPTION OF THE PREFERRED EMBODIMENTS

Figure 1:
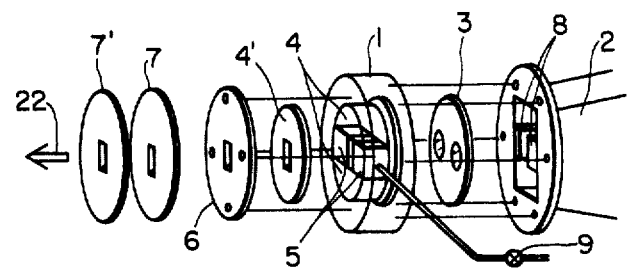
FIG. 1 is an exploded view of a conventional microwave plasma ion source.
Figure 2:
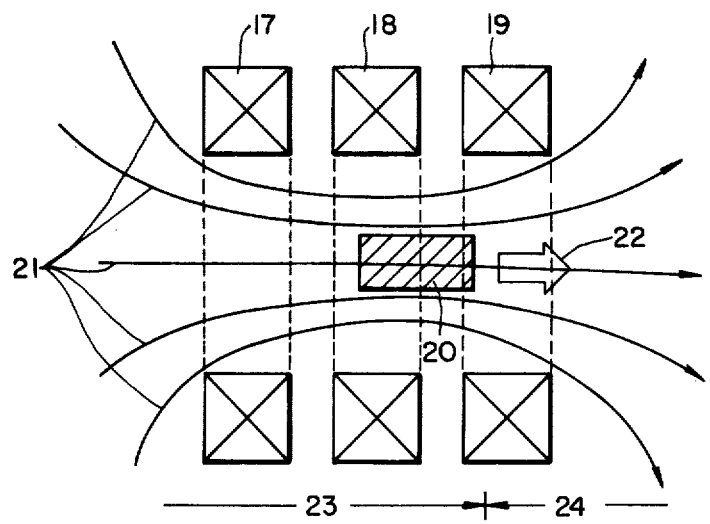
FIG. 2 is a model chart illustrating a magnetic field generating mechanism in the microwave plasma ion source shown in FIG. 1.
Figure 3:
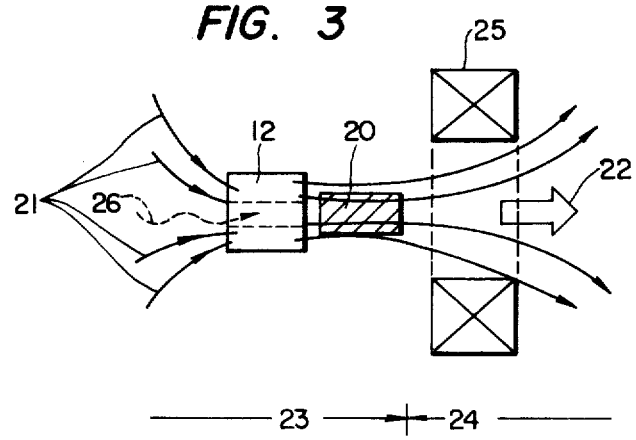
FIG. 3 is a model chart illustrating the principle of a magnetic field generating mechanism in a microwave plasma ion source according to the present invention.

FIG. 3 illustrates the principle of a microwave plasma ion source according to the present invention. The construction of a microwave plasma ion source according to the present invention is the same as that of a conventional microwave plasma ion source shown in FIG. 1 except the construction of a magnetic field generating means for forming a magnetic field in a discharge zone 20. Accordingly, that part of an ion source according to the present invention which corresponds to a discharge region formed between discharge electrodes 5, 5 in a discharge chamber 1 in a conventional ion source shown in FIG. 1 is illustrated as a discharge zone 20.

As shown in FIG. 3, a microwave plasma ion source according to the present invention is provided with a solenoid coil 25 on the low-voltage side 24, and a magnetic substance 12 having a high permeability, such as pure iron on the microwave 26 admission side, i.e. the waveguide side of the discharge zone 20 to increase the magnetic flux density of lines of magnetic force 21 generated by the magnetic coil 25 and form in the discharge zone 20 a magnetic field of such a shape and intensity as are necessary for microwave discharge. It is desirable that the high-permeable member 12 be shaped and positioned such as to permit the microwaves to enter the same freely. This arrangement permits forming a microwave plasma ion source having various excellent characteristics mentioned above.

Examples of the present invention will be described.

EXAMPLE 1

Figure 4:
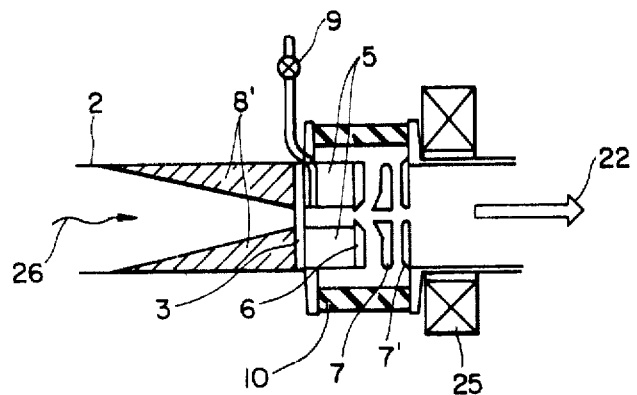
FIGS. 4-9 are sectional views of microwave plasma ion sources embodying the present invention.

FIG. 4 is a sectional view of an embodiment of a microwave plasma ion source according to the present invention. The characteristics of this embodiment reside in that ridges 8', 8' in a waveguide 2 are made of a magnetic substance, such as pure iron for reforming the magnetic field, and in that a solenoid coil 25 is provided on the low-voltage side. This structure permits generating in a discharge region formed between discharge electrodes 5, 5 a magnetic field of such shape and intensity as are necessary for discharge even when a weak current is applied to the solenoid coil 25 without changing the waveguide 2, discharge chamber and ion extraction electrodes 6, 7, 7' at all. Reference numeral 10 denotes a high-voltage insulator.

EXAMPLE 2

Figure 5:
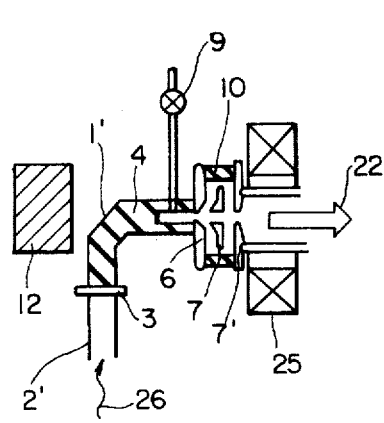

FIG. 5 is a sectional view of another embodiment of a microwave plasma ion source according to the present invention. The characteristics of this embodiment reside in a discharge chamber 1'. The discharge chamber 1' consists of an L-shaped rectangular waveguide, and the whole of the interior of the waveguide except a discharge region therein is filled with a dielectric, such as boron nitride. A means for generating a suitable magnetic field in the discharge region consists of a solenoid coil 25 provided on the low-voltage side and a magnetic member 12 of pure iron provided in the vicinity of a bent portion of the L-shaped discharge chamber 1'. Needless to say, a rectangular waveguide 2' is used is this embodiment.

EXAMPLE 3

Figure 6:
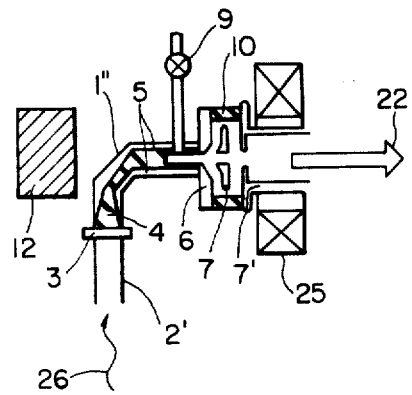

FIG. 6 is a sectional view of still another embodiment of a microwave plasma ion source according to the present invention. The characteristics of this embodiment reside in a discharge chamber 1''. The discharge chamber 1'' consists of an L-shaped rectangular ridge waveguide, and a dielectric 4, such as boron nitride is placed in the whole of the space between the ridges except a discharge region. The discharge chamber 1'' is identical with the discharge chamber 1' in Example 2 shown in FIG. 5 except that ridges (discharge electrodes) 5, 5 are added. A means for generating a suitable magnetic field in the discharge region used in this Example has the same structure as that used in Example 2.

EXAMPLE 4

Figure 7:
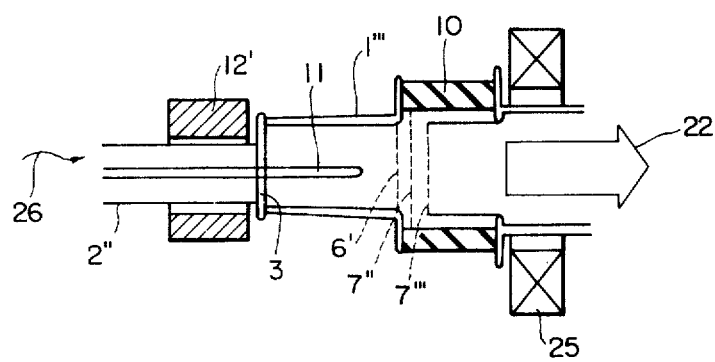

FIG. 7 is a sectional view of a further embodiment of a microwave plasma ion source according to the present invention. The characteristics of this embodiment reside in that a coaxial waveguide 2'', a coaxial discharge chamber 1''' aligned with the waveguide with the waveguide 2'', and multi-aperture ion-extraction electrodes 6', 7'', 7''' are provided. A means used in this Example for generating a suitable magnetic field in a discharge region consists of a solenoid coil provided on the low-voltage side and a cylindrical high-permeability member 12' consisting of pure iron and provided such as to surround that portion of the coaxial waveguide 2'' which is close to the discharge chamber 1'''. Reference numeral 11 denotes an antenna.

EXAMPLE 5

Figure 8:
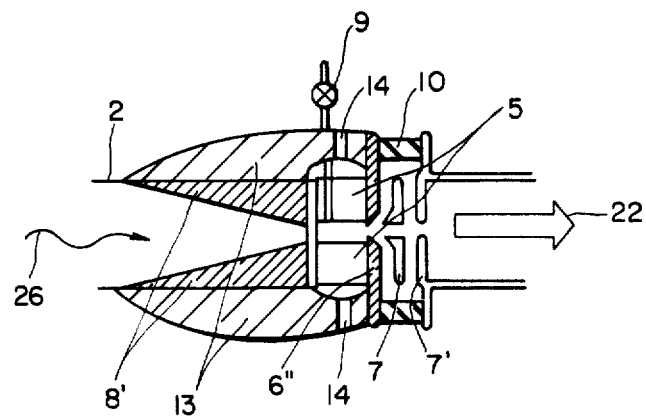

FIG. 8 is a sectional view of a further embodiment of a microwave plasma ion source according to the present invention. The characteristics of this embodiment reside in that a special magnetizing means is provided, which can be substituted for the solenoid coil 25 used in Example 1. This magnetizing means, which is substituted for the above-mentioned solenoid coil 25, consists of an electrode 6'' composed of a magnetic substance, such as pure iron and used instead of the ion extraction electrode 6 among the electrodes 6, 7, 7' used in Example 1; ridges 8', 8' of the same magnetic substance as mentioned above; an electrode 6''; external magnetic circuits 13, 13 connecting the ridges 8', 8' and the electrode 6'' together; and a permanent magnet or a coil 14 provided at intermediate portions of the external magnetic circuits 13, 13. This magnetizing means of the above-described structure permits generating a magnetic field necessary for forming discharge in a discharge region between discharge electrodes 5, 5. Needless to say, this magnetizing means can be substituted for the solenoid coils 25 used in Examples 2–4.

EXAMPLE 6

Figure 9:
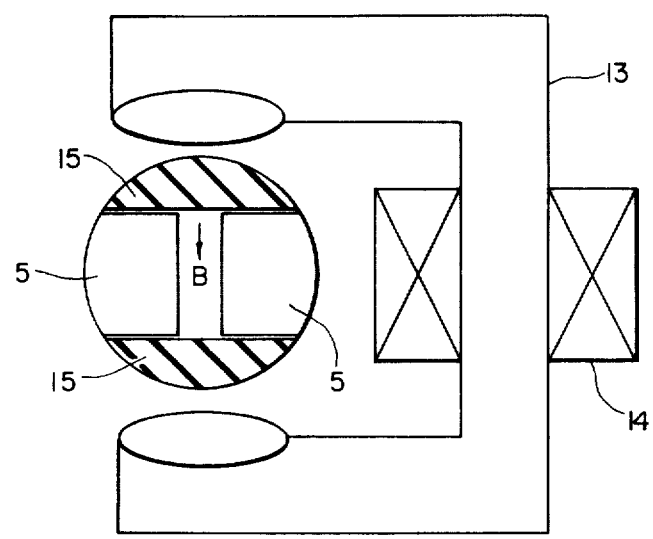

FIG. 9 is a sectional view of a further embodiment of a microwave plasma ion source according to the present invention. The characteristics of this embodiment reside in that a special magnetizing means which can be substituted for the solenoid coils 25 used in Example 1. In this embodiment, a magnetic field is applied not in the axial direction but in a direction which is between discharge electrodes 5, 5 and which is at right angles to the axis. A space to which a magnetic field is applied in this embodiment is only the one between the discharge electrodes 5, 5. Those portions of this embodiment which correspond to such portions of a conventional ion source shown in FIG. 1 that are filled with a dielectric 4 such as boron nitride, is filled with ferrite. A magnetic circuit 13 is provided outside the ferrite-packed portions 15, 15 and excited by a coil 14. This structure permits generating a magnetic field only in the space between the ferrite-packed portions 15, 15, and a microwave electric field and the direction of its magnetic field B meet at right angles. Since the permeability of the ferrite-packed portions 15, 15 is high, a strong magnetic field is generated therebetween even when an exciting current from the coil 14 flows at a low rate. The coil 14 may be substituted by a permanent magnet provided in an intermediate portion of the magnetic circuit 13. The ferrite-packed portions 15, 15 may not be of a semi-circular shape; they may be narrowed such as to be disposed in opposition to longitudinal end portions only of a discharge region formed between the discharge electrodes 5, 5. It is, of course, necessary in this case that the remaining spaces be filled with a dielectric, such as boron nitride. Needless to say, the magnetizing means used in this Example can be applied to the rectangular waveguide type discharge chambers used in Examples 2–3.

As is clear from the above, the present invention permits obtaining a miniaturized, electric power-saving microwave plasma ion source.

Incidentally, Fe-Ni alloy, such as permalloy, ferrite and silicon steel in addition to pure iron can be suitably used as a magnetic substance in the present invention.

We claim:

1. A microwave plasma ion source comprising a source for generating microwaves, a waveguide connected to said source for propagating the microwaves, a discharge chamber provided in an end portion of said waveguide to form a plasma therein by applying an electric field generated by the microwaves admitted thereinto and a magnetic field to a discharge gas introduced thereinto, ion extraction electrodes provided adjacent to said discharge chamber so as to extract ions from the plasma, a solenoid provided on the low-voltage side of said ion extraction electrodes so as to form the magnetic field in said discharge chamber, and a high-permeability member arranged adjacent to slaid waveguide on the microwave admission side of said discharge chamber for permitting the microwaves to be propagated freely and for setting the shape of the magnetic field.

2. A microwave plasma ion source according to claim 1, wherein said waveguide consists of a ridged waveguide, said high-permeability member constituting the ridge.

3. A microwave plasma ion source according to claim 1, wherein said waveguide consists of a coaxial waveguide, said high-permeability member being arranged so as to surround said coaxial waveguide.

4. A microwave plasma ion source according to claim 1, wherein said solenoid is arranged on the side of a ground potential electrode of said ion extraction electrodes.

5. A microwave plasma ion source according to claim 1, wherein said high-permeability member is arranged exteriorly of said waveguide.

6. A microwave plasma ion source according to claim 5, wherein said waveguide includes a bent portion, said high-permeability member being arranged adjacent to said bent portion.

* * * * *